(12) United States Patent
Vemulapati et al.

(10) Patent No.: US 12,733,225 B2
(45) Date of Patent: Sep. 8, 2026

(54) GATE-COMMUTED THYRISTOR CELL WITH A BASE REGION HAVING A VARYING THICKNESS

(71) Applicant: Hitachi Energy Ltd, Zürich (CH)

(72) Inventors: Umamaheswara Vemulapati, Windisch (CH); Neophytos Lophitis, Leicestershire (GB); Jan Vobecky, Prague (CZ); Florin Udrea, Cambridge (GB); Thomas Stiasny, Wädenswil (CH); Chiara Corvasce, Bergdietikon (CH); Marina Antoniou, Hardwick (GB)

(73) Assignee: HITACHI ENERGY LTD, Zürich (CH)

( * ) Notice: Subject to any disclaimer, the term of this patent is extended or adjusted under 35 U.S.C. 154(b) by 371 days.

(21) Appl. No.: 18/280,049

(22) PCT Filed: Jan. 31, 2022

(86) PCT No.: PCT/EP2022/052225
§ 371 (c)(1),
(2) Date: Sep. 1, 2023

(87) PCT Pub. No.: WO2022/184353
PCT Pub. Date: Sep. 9, 2022

(65) Prior Publication Data

US 2024/0162295 A1 May 16, 2024

(30) Foreign Application Priority Data

Mar. 2, 2021 (EP) .................................... 21160204

(51) Int. Cl.
*H10D 62/17* (2025.01)
*H10D 18/00* (2025.01)
(Continued)

(52) U.S. Cl.
CPC ......... *H10D 62/206* (2025.01); *H10D 18/241* (2025.01); *H10D 18/65* (2025.01); *H10D 18/80* (2025.01); *H10D 84/136* (2025.01)

(58) Field of Classification Search
CPC ...... H10D 18/241; H10D 18/65; H10D 18/80; H10D 62/126; H10D 62/142;
(Continued)

(56) References Cited

U.S. PATENT DOCUMENTS 4,170,502 A * 10/1979 Watakabe ............... H01L 21/22 438/137
4,984,049 A * 1/1991 Nishizawa ............. H10D 62/60 257/E29.037
(Continued)

FOREIGN PATENT DOCUMENTS

CN 105590959 A 5/2016
CN 104795439 B 7/2017
(Continued)

OTHER PUBLICATIONS

Lophitis et al., "Experimentally Validated Three Dimensional GCT Wafer Level Simulations", Proceedings of the 2012 24th International Symposium on Power Semiconductor Devices and ICs Jun. 3-7, 2012—Bruges, Belgium, 978-1-4577-1597-6/12/$26.00 © 2012 IEEE, pp. 349-352.
(Continued)

*Primary Examiner* — Natalia A Gondarenko
(74) *Attorney, Agent, or Firm* — PROCOPIO, CORY, HARGREAVES & SAVITCH LLP

(57) ABSTRACT

A power semiconductor device (1) comprises a gate-commutated thyristor cell (20) including a cathode electrode (2), a cathode region (9) of a first conductivity type, a base layer (8) of a second conductivity type, a drift layer (7) of the first conductivity type, an anode layer (5) of the second conduc-
(Continued)

tivity type, an anode electrode (3) and a gate electrode (4). The base layer (8) comprises a cathode base region (81) located between the cathode region (9) and the drift layer (7) and having a first depth (D1), a gate base region (82) located between the gate electrode (4) and the drift layer (7) and having a second depth (D2), and an intermediate base region (83) located between the cathode base region (81) and the gate base region (82) and having two different values of a third depth (D3) being between the first depth (D1) and the second depth (D2).

15 Claims, 11 Drawing Sheets

(51) Int. Cl.
*H10D 18/65* (2025.01)
*H10D 18/80* (2025.01)
*H10D 84/00* (2025.01)

(58) Field of Classification Search
CPC .... H10D 62/206; H10D 62/199; H10D 18/01; H10D 18/00; H10D 18/021; H10D 18/211; H10D 18/221; H10D 18/40; H10D 18/60; H10D 62/104; H10D 62/105; H10D 62/108; H10D 62/111; H10D 62/117; H10D 62/123; H10D 62/124; H10D 62/125; H10D 62/141; H10D 62/148; H10D 62/60; H10D 62/114; H10D 62/115; H10D 64/233; H10D 64/291; H10D 64/519; H10D 84/131; H10D 84/135; H10D 84/136; H10D 84/676; H10D 18/655; H10D 62/129; H10D 18/031; H10D 18/251; H10D 64/011; H10D 64/0111; H10D 84/138
USPC ....... 257/147, 153, 107, 120, 132, 133, 137, 257/138, 139, 140, 142
See application file for complete search history.

(56) References Cited

U.S. PATENT DOCUMENTS

| | | | | |
|---|---|---|---|---|
| 5,223,442 | A * | 6/1993 | Kitagawa | H10D 8/045 438/137 |
| 5,369,291 | A * | 11/1994 | Swanson | H10D 18/00 257/107 |
| 7,816,706 | B2 | 10/2010 | Ramiho et al. | |
| 8,823,052 | B2 | 9/2014 | Ramiho et al. | |
| 2008/0164490 | A1* | 7/2008 | Rahimo | H10D 18/60 257/E21.388 |
| 2009/0206364 | A1* | 8/2009 | Lee | H10D 64/256 257/E29.199 |
| 2013/0207157 | A1* | 8/2013 | Rahimo | H10D 18/221 257/124 |
| 2018/0204913 | A1* | 7/2018 | Arnold | H10D 62/148 |

FOREIGN PATENT DOCUMENTS

| | | | |
|---|---|---|---|
| CN | 108242465 | A | 7/2018 |
| EP | 0190934 | B1 | 1/1992 |
| EP | 0736909 | A2 | 10/1996 |
| EP | 2622639 | B1 | 1/2015 |
| JP | 61-183966 | A | 8/1986 |
| JP | 2013-515365 | A | 5/2013 |
| JP | 2013-543260 | A | 11/2013 |

OTHER PUBLICATIONS

Arnold et al., "High temperature Operation of HPT+IGCTs", PCIM Europe 2011, May 17-19, 2011, Nuremberg, Germany, Paper 4, pp. 32-37.

Wikstrom et al., "The Corrugated P-Base IGCT—a New Benchmark for Large Area SOA Scaling", Proceedings of the 19th International Symposium on Power Semiconductor Devices & ICs May 27-30, 2007 Jeju, Korea, 1-4244-1096-7/07/$25.00 © 2007 IEEE, pp. 29-32.

Lophitis et al., "The Destruction Mechanism in GCTs", IEEE Transactions On Electron Devices, vol. 60, No. 2, Feb. 2013, pp. 819-826.

* cited by examiner 1
21
31
2
20
4
9
4
32
8
7
33
6
5
3
22

1
21
31
2
20
9
4
4
81
82
82
8
32
7
33
6
5
3
22

1
21
31
2
20
4
9
81
83
8
82
83
82
32
7
6
33
61
61
5
3
22
62

1
21
31
2
20
9
4
81
83
8
83
82
82
32
7
6
33
51
51
5
3
22
52

1
21
2a
2
20
4
9
31
81
83
83
8
82
82
32
10
10
11
11
7
6
33
5
3
22

GATE-COMMUTED THYRISTOR CELL WITH A BASE REGION HAVING A VARYING THICKNESS

CROSS-REFERENCE TO RELATED APPLICATIONS

This application is US National Stage of International Patent Application PCT/EP2022/052225, filed Jan. 31, 2022, which claims priority to European Patent Application No. 21160204.0, filed on Mar. 2, 2021, the contents of which are incorporated herein by reference.

The present disclosure relates to a power semiconductor device.

Document U.S. Pat. No. 7,816,706B2 describes a power semiconductor device.

The disclosure relates to the field of power semiconductor devices, more specifically but not restricted to, high voltage power semiconductor devices. A power semiconductor device includes e.g. a four-layer npnp active thyristor structure which can be turned off via a gate. The power semiconductor device may comprise a gate-commutated thyristor cell or a plurality of gate-commutated thyristor cells.

Publication "High Temperature Operation of HPT+IGCTs", M. Arnold et al., proceedings of PCIM Europe, May 17-19, 2011, Germany is related to an integrated gate-commutated thyristor, abbreviated IGCT.

Document CN 108242465 A describes a gate commutated thyristor and a preparation method thereof. The document by TOBIAS WIKSTROM ET AL: "The Corrugated P-Base IGCT—a New Benchmark for Large Area SQA Scaling", POWER SEMICONDUCTOR DEVICES AND IC'S, 2007. ISPSD'07. 19$^{TH}$ INTERNATIONAL SYMPOSIUM ON, IEEE, PI, 1 May 2007 (2007-05-01), pages 29-32, XP031129660, ISBN: 978-1-4244-1 095-8, describes an IGCT with extraordinary Safe Operating Area (SOA). Document EP 2 622 639B1 describes a reverse conducting power semiconductor device. Document CN 104 795 439B describes a gate commutated thyristor chip.

Embodiments of the disclosure relate to provide a power semiconductor device with an improved turn-off performance.

According to an embodiment, a power semiconductor device comprises a gate-commutated thyristor cell, a first main side and a second main side opposite to the first main side. The gate-commutated thyristor cell comprises in the order from the first main side to the second main side a cathode electrode arranged on the first main side, a cathode region of a first conductivity type, a base layer of a second conductivity type forming a first junction to the cathode region, a drift layer of the first conductivity type forming a second junction with the base layer, an anode layer of the second conductivity type and an anode electrode arranged on the second main side. The second conductivity type is different than the first conductivity type. The gate-commutated thyristor cell further comprises a gate electrode which is arranged lateral to the cathode region. The base layer comprises a cathode base region located between the cathode region and the drift layer and having a first depth, a gate base region located between the gate electrode and the drift layer and having a second depth, and an intermediate base region located between the cathode base region and the gate base region and having at least two different values of a third depth. The at least two values of the third depth are both larger than the first depth and smaller than the second depth.

Advantageously, the gate-commutated thyristor cell includes three and more distinct base regions. The cathode base region can be optimized for best on-state performance, the gate base region can be configured for best turn-off performance and the intermediate base region brings one extra degree of freedom in optimization, essentially allowing the gate base region and the cathode base region to be optimized independently; thus, the gate-commutated thyristor cell achieves both a lower on-state voltage and increased turn-off current capability.

"Depth" is herein understood to be the thickness, measured in direction from the first main side to the second main side.

The first main side and/or the second main side may be flat within the limits of manufacturing tolerances.

The second junction may have the following shape: When moving over the gate base region in lateral direction, i.e. parallel to the second main side, the second junction may be on a constant height with respect to the second main side. When moving over the intermediate base region in lateral direction away from the gate base region and towards the cathode base region, the height of the second junction may increase monotonously, e.g. strictly monotonously. When moving over the cathode base region, the height of the second junction may always be greater than in the gate base region and/or than in the intermediate region.

According to a further embodiment, the cathode electrode forms an ohmic contact with the cathode region. The anode electrode forms an ohmic contact with the anode layer. The gate electrode forms an ohmic contact with the base layer. The anode layer is separated from the base layer by the drift layer. The first and the second junction are implemented as p-n junctions. The base layer may include a further region.

According to a further embodiment, the intermediate base region includes the region between a gap between the gate electrode and the cathode region on one side and the second junction on the other side. The two different values of the third depth may be in this region. For example, the two different values of the third depth do not overlap with the cathode electrode and the gate electrode in lateral direction pointing from the gate base region towards the cathode base region.

According to a further embodiment, the intermediate base region additionally includes at least one of an adjacent region between the gate electrode and the second junction and an adjacent region between the cathode region and the second junction.

According to a further embodiment, a maximum or average doping concentration of the gate base region is higher than a maximum or average doping concentration of the intermediate base region. The maximum or average doping concentration of the intermediate base region is higher than a maximum or average doping concentration of the cathode base region. "Higher" may mean a factor of at least two or at least ten.

According to a further embodiment, the doping concentration (average or maximum) of the intermediate base region and/or of the gate base region at the first main side or in the area closest to the first main side is higher than a doping concentration (maximum or average) of the cathode base region at the first junction and/or in the area closest to the first main side.

According to a further embodiment, the first depth is the minimum depth of the cathode base region. The second depth is the maximum depth of the gate base region.

According to a further embodiment, the first depth is the minimum distance of the cathode region to the drift layer. The second depth is the maximum distance of the gate electrode to the drift layer.

According to a further embodiment, each of values of the third depth are larger than the first depth and less than the second depth. Advantageously, a smooth transition from the cathode base region to the gate base region is achieved by the intermediate base region.

According to a further embodiment, the part of the second junction which is located between the intermediate base region and the drift layer includes a first base transition region forming a step, a second base transition region forming a further step and a plane between the first and the second base transition region. Herein, a plane is e.g. a section running parallel to the first and/or second main side.

According to a further embodiment, the cathode region has a form of a group comprising a circle, a rectangle, an octagon and a hexagon at the first main side. The form can be seen in a top view on the power semiconductor device. Advantageously, the shapes of cathode regions or cathode electrodes allow a flexible design for a low gate resistance and inductance including more degree of freedom for an improved performance and design automation.

According to a further embodiment, the gate electrode encloses the cathode region at the first main side.

According to a further embodiment, the anode layer includes a gate anode region and a cathode anode region. A maximum doping concentration of the gate anode region is less than a maximum doping concentration of the cathode anode region. The gate anode region is adjacent to the gate electrode. The cathode anode region is adjacent to the cathode region. Thus, the anode layer is split in two distinct regions or areas: The cathode anode region is located vertically under the cathode region and the gate anode region is located vertically under the gate electrode. The gate anode region under the gate has a reduced doping concentration e.g. to reduce a PNP transistor gain.

According to a further embodiment, the gate-commutated thyristor cell comprises a buffer layer of the first conductivity type. The buffer layer is located between the drift layer and the anode layer. The buffer layer includes e.g. a gate buffer region and a cathode buffer region. A maximum doping concentration of the gate buffer region is higher than a maximum doping concentration of the cathode buffer region. Thus, the buffer layer is split in two distinct regions or areas: The cathode buffer region is located vertically under the cathode region and the gate buffer region is located vertically under the gate electrode. The gate buffer region under the gate has e.g. an increased doping concentration to reduce the PNP transistor gain.

According to a further embodiment, the gate-commutated thyristor cell is implemented as an integrated gate-commutated thyristor cell, abbreviated IGCT cell. The gate-commutated thyristor cell can be turned off by a signal provided to the gate electrode. The gate-commutated thyristor cell can be implemented as a component out of a group comprising an asymmetric integrated gate-commutated thyristor cell—abbreviated asymmetric IGCT—, a reverse conducting integrated gate-commutated thyristor cell—RC-IGCT cell —, a reverse blocking integrated gate-commutated thyristor cell—RB-IGCT cell—and a bidirectional turn-off thyristor cell—BTT cell —. Thus, the proposed gate-cathode design concept can be applicable to different GCT families such as asymmetric IGCT, reverse conducting IGCT, reverse blocking IGCT and BTT. The RB-IGCT cell is configured to block in both forward and reverse directions.

According to an embodiment, the power semiconductor device is fabricated by a method comprising:

- providing a semiconductor substrate with the drift layer of the first conductivity type,
- providing the cathode region of the first conductivity type,
- providing the anode layer of the second conductivity type,
- providing the cathode electrode on the first main side and the gate electrode on the first main side lateral to the cathode region,
- providing the anode electrode on the second main side, and
- fabricating the base layer of the second conductivity type.

According to a further embodiment, the base layer is fabricated by performing a gate base doping process, an intermediate base doping process and a cathode base doping process such that after fabricating of the power semiconductor device the base layer comprises:

- a cathode base region located between the cathode region and the drift layer and having a first depth,
- a gate base region located between the gate electrode and the drift layer and having a second depth, and
- an intermediate base region located between the cathode base region and the gate base region and having at least two different values of a third depth. The two values of the third depth are both larger than the first depth and smaller than the second depth.

Advantageously, the intermediate base region allows to decouple the gate base region from the cathode base region. Advantageously, the power semiconductor device has an increased turn-off capability and reduced on-state voltage drop. The steps and processes indicated above are not performed in the order given above. The method for fabricating a power semiconductor device is suitable for the power semiconductor device. Features and advantages described in connection with the power semiconductor device can therefore be used for the method and vice versa.

According to a further embodiment, the intermediate base doping process includes depositing a first mask covering at least part of an area of the cathode region and performing a first ion implantation process. The gate base doping process includes depositing a second mask covering the area of the cathode region and at least a part of an area of the intermediate base region and performing a second ion implantation process. The cathode base doping process includes performing a third ion implantation process without using a mask.

According to a further embodiment, the power semiconductor device is implemented as a fine pattern gate-commutated thyristor, abbreviated GCT, with reduced on-state losses and increased turn-off capability. This is achieved by a fine pattern cell design. The power semiconductor device belongs e.g. to the field of bipolar silicon devices.

According to a further embodiment, in the proposed GCT design concept the depths and doping profiles of the p-base regions are optimized. The base layer can be named p-base layer. The base layer has three distinct regions: (i) the cathode base region with relatively small depths and maximum doping concentration, (ii) the gate base region with larger depths and maximum doping concentration compared to the cathode base region, and (iii) the intermediate base region with intermediate depth and maximum doping concentration compared to the cathode base region and the gate base region. The intermediate base region (also named intermediate p-base region) brings one extra degree of freedom in optimization, essentially allowing the gate base region (also named gate p-base region) and the cathode base region (also named cathode p-base region) to be optimized independently; the cathode base region is designed for best on-state performance and the gate base region is configured for best turn-off performance which in turn results in reduced on-state voltage drop and increased turn-off current capability. The power semiconductor device (together with planar GCT) is enabler of fine pattern GCT (reduced cathode and gate feature sizes) and the cellular design of cathode regions as well.

According to a further embodiment, the power semiconductor device optimizes the state-of-the-art trade-off between the on-state voltage VT and maximum controllable current (abbreviated MCC)—it allows for a much reduced on-state voltage drop and at the same time higher current controllability. This is achieved by structuring the base layer with at least three different levels of maximum doping concentration and depth. A doping concentration could also be named e.g. doping density.

According to a further embodiment, the gate-commutated thyristor cell does not feature a uniform base depth or only two distinct base regions. The gate-commutated thyristor cell allows better handling of the carriers generated during dynamic avalanche, and better extraction of plasma and holes during turn-off. Thus, any localized increase in current density does not have the negative impact of latching (re-triggering) the thyristor. The MCC can be achieved without increasing the on-state voltage. Conversely, the power semiconductor device achieves a high MCC and also reduces the on-state voltage.

According to a further embodiment, the gate-commutated thyristor cell with three and more distinct p-base regions is designed for lower on-state voltage (conduction losses) and increased turn-off current capability at the same time (multi-level corrugation). The gate-commutated thyristor cell e.g. has a reduced width of the cathode and/or gate regions below 250 μm in combination with the multi-level corrugation. In an example, the gate-commutated thyristor cell includes split buffer regions and/or split anode regions. The gate-commutated thyristor cell obtains a smaller feature size of cell designs with cathode shapes such as hexagonal, octagonal, circular and/or rectangular (stripe form).

According to a further embodiment, the power semiconductor device obtains lower losses and higher ruggedness opening the door towards higher power densities. The method makes available the processing of GCTs with enhanced performance. The smaller the better when the base is shallow and when the temperature increases. In an example, when the base is shallower than 75 μm, a narrow finger, e.g. <150 μm, will help improve the MCC width. The gate contact region is typically of equal dimensions to that of the cathode region. A gate-commutated thyristor cell can be realized with narrower cathode and gate regions (e.g. cathode region width below 250 μm).

The present disclosure comprises several aspects of a power semiconductor device and a corresponding fabrication method. Every feature described with respect to one of the aspects is also disclosed herein with respect to the other aspect, even if the respective feature is not explicitly mentioned in the context of the specific aspect.

The accompanying figures are included to provide a further understanding. In the figures, elements of the same structure and/or functionality may be referenced by the same reference signs. It is to be understood that the embodiments shown in the figures are illustrative representations and are not necessarily drawn to scale.

Figure 1:
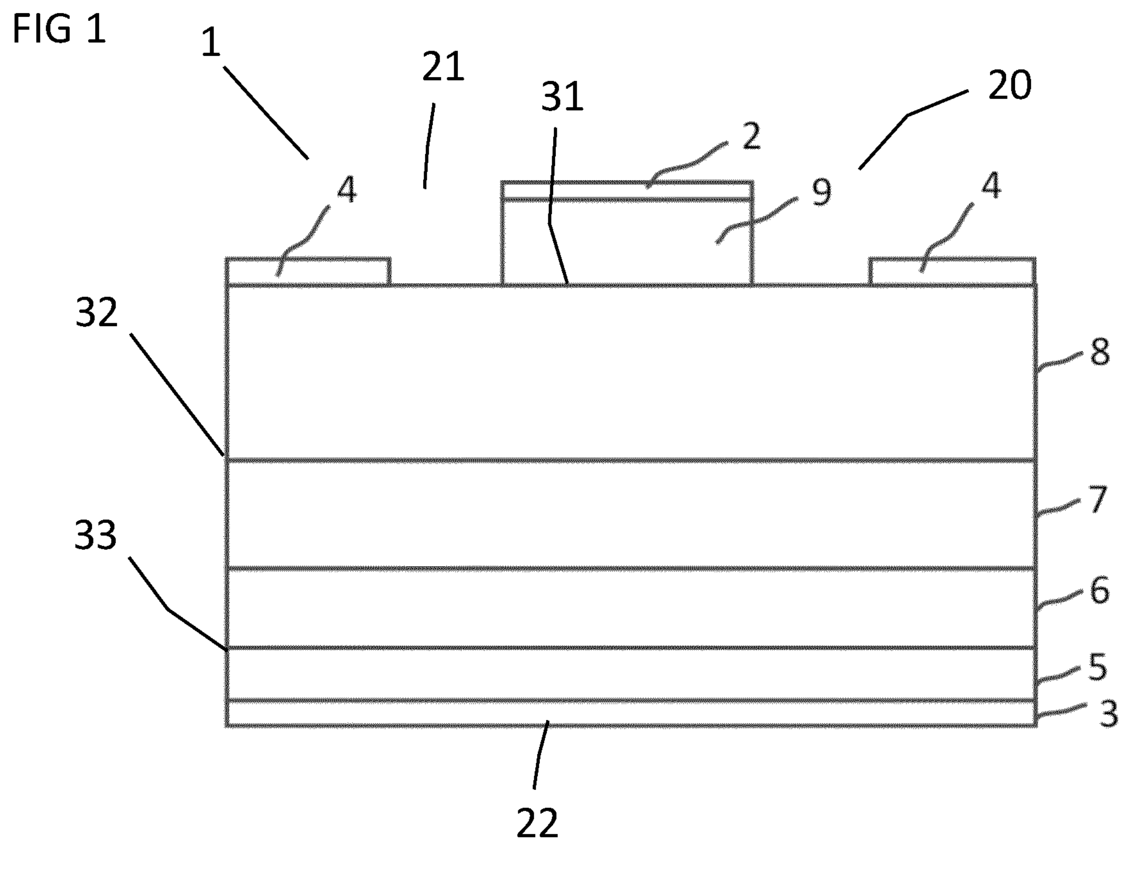
FIGS. 1, 2, 3A, 3B and 4 to 6 are cross sections of a power semiconductor device according to different embodiments.

FIG. 1 is a cross section of a power semiconductor device 1 according to an embodiment. The power semiconductor device 1 includes a four-layer npnp active thyristor structure which can be turned off by applying a negative voltage between a gate electrode 4 and a cathode electrode 2. The power semiconductor device 1 includes a gate-commutated thyristor cell 20, abbreviated cell. The power semiconductor device 1 comprises a first main side 21 and a second main side 22. FIG. 1 shows a known gate-commutated thyristor cell. The cell has an anode layer 5, a buffer layer 6, a drift layer 7 (which can be named second base layer), a base layer 8 and a cathode region 9 (which also can be named cathode layer). The cathode region 9 is formed by an n+ doped region. The cathode region 9 is contacted to the cathode electrode 2 which also can be named cathode metallization. The base layer 8 is implemented as a p doped base layer and contacts the cathode region 9 on the opposite side of the cathode electrode 2.

The drift layer 7 is n doped and may also be named n doped second base layer. The base layer 8 is p doped. The drift layer 7 contacts the base layer 8 on the opposite side of the cathode region 9. The buffer layer 6 is n doped. The buffer layer 6 contacts the drift layer 7 on the opposite side of the base layer 8. The anode layer 5 or anode region is p doped. The anode layer 5 of the power semiconductor device 1 contacts the buffer layer 6 on the opposite side of the base layer 8. An anode electrode 3 which may be named anode metallization is contacted to the anode layer 5 on the opposite side of the buffer layer 6. A first conductivity type is realized by n-doped layers or regions. A second conductivity type is realized by p-doped layers or regions. The second conductivity type is different from the first conductivity type.

The integrated gate-commutated thyristor (abbreviated IGCT) is a high voltage (HV) single wafer semiconductor device which is made by a number of gate-commutated thyristor cells 20 (GCT cells). Each GCT cell 20 contains the cathode electrode 2, the gate electrode 4 and the anode electrode 3. The GCT cell 20 includes at least one gate electrode 4—also named gate contact—in the form of an annular metallic region either in the middle, the center and/or the perimeter of the power semiconductor device wafer, also called GCT wafer. The gate contact region is a physical continuation of all the gate electrodes 4 in the wafer which means the gate electrodes 4 are electrically and thermally connected to each other and e.g. together with a gate contact region. Each GCT cell 20 includes or consists of four layers of different conductivity forming the thyristor structure.

A state of the art GCT cell turns off by application of a voltage at the gate electrode 4. Holes are extracted from the base layer 8 to the gate electrode 4 and very quickly all injection of electrons from the cathode region 9 stops. During the next phase of the turn-off, the cathode region 9 stays off until the device turns off completely. Thereafter and until the power semiconductor device 1 turns off completely, only the doped base layer 8, the doped drift layer 7, the doped buffer layer 6 and the doped anode layer 5 conduct current; they result in a combination of semiconductor layers which resembles an open base PNP transistor. An IGCT may fail when turning off large current because of parasitic retriggering of the thyristor during turn-off. The latter is due to a high current density observed at the vicinity of at least one cathode segment in the wafer device, a phenomenon induced because of dynamic avalanche and inherent design asymmetries and electrical impedance imbalances.

The power semiconductor device 1 with the internal structure of a thyristor can be turned off via the gate electrode 4 with an increased capability to turn off current when during turn-off, all or a reduced number of carriers are kept away from the vicinity of the cathode region 9. Conversely, a reduction of the on-state losses can be achieved by enhancing the injection of electrons from the cathode, by reducing the electrons recombination by reducing the thickness and/or maximum doping concentration of base layer 8 of the power semiconductor device 1, which has the reverse effect on the turn-off capability.

The interface between the cathode region 9 and the base layer 8 and the interface between the gate electrode 4 and the base layer 8 are located in a single plane. The interface between the cathode region 9 and the base layer 8 and the interface between the gate electrode 4 and the base layer 8 are flat and coplanar. The base layer 8 and the cathode region 9 form a first junction 31. The drift layer 7 and the base layer 8 form a second junction 32. The buffer layer 6 and the anode layer 5 form a third junction 33. In case the buffer layer is omitted, the drift layer 7 and the anode layer 5 form the third junction 33.

Figure 2:
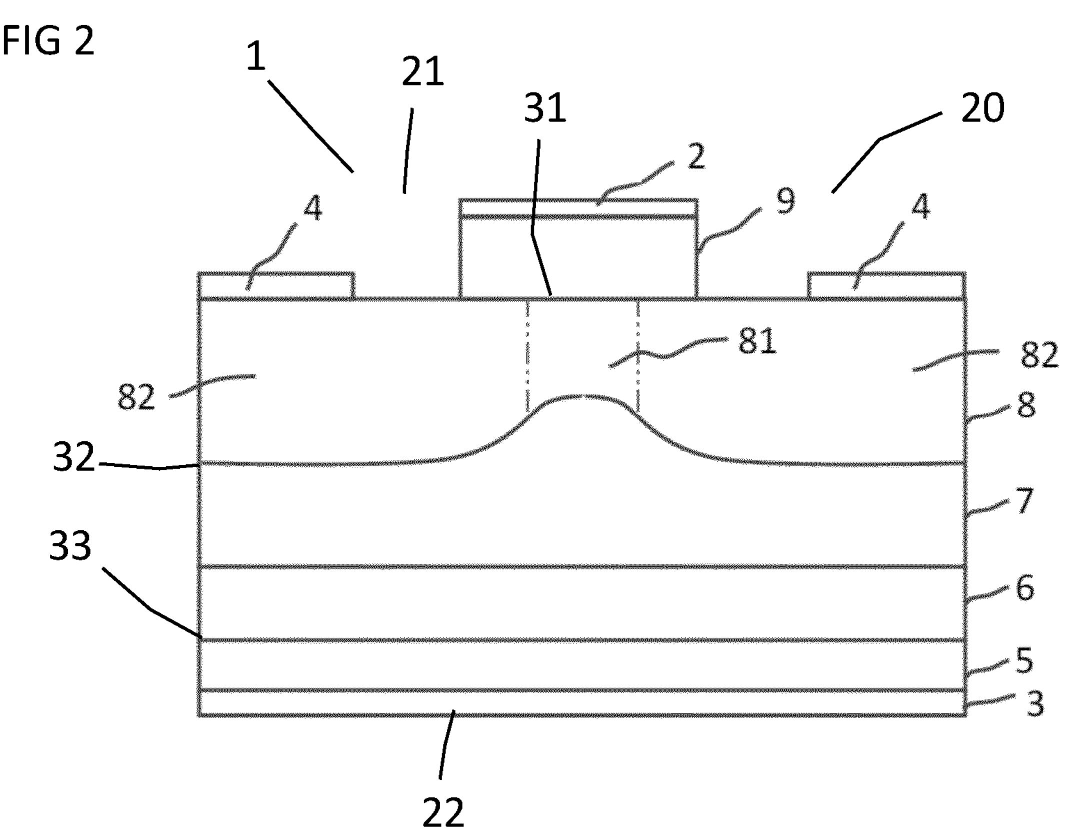

FIG. 2 is a cross section of a power semiconductor device 1 according to an embodiment which is a further development of the embodiment shown in FIG. 1. The p doped base layer 8 of the GCT cell 20 has two distinct regions, a cathode base region 81 adjacent to the cathode region 9 and a gate base region 82 adjacent to the gate electrode 4, but disposed at a distance from the cathode region 9. The gate base region 82 has a higher maximum doping concentration than the cathode base region 81 and/or the gate base region 82 has a greater depth than the cathode base region 81 in order to modulate the field in blocking state and to defocus generated holes from the cathode when driven into dynamic avalanche. The cathode base region 81 may also be named cathode p-base region. The gate base region 82 may be named gate p-base region.

Figure 3A:
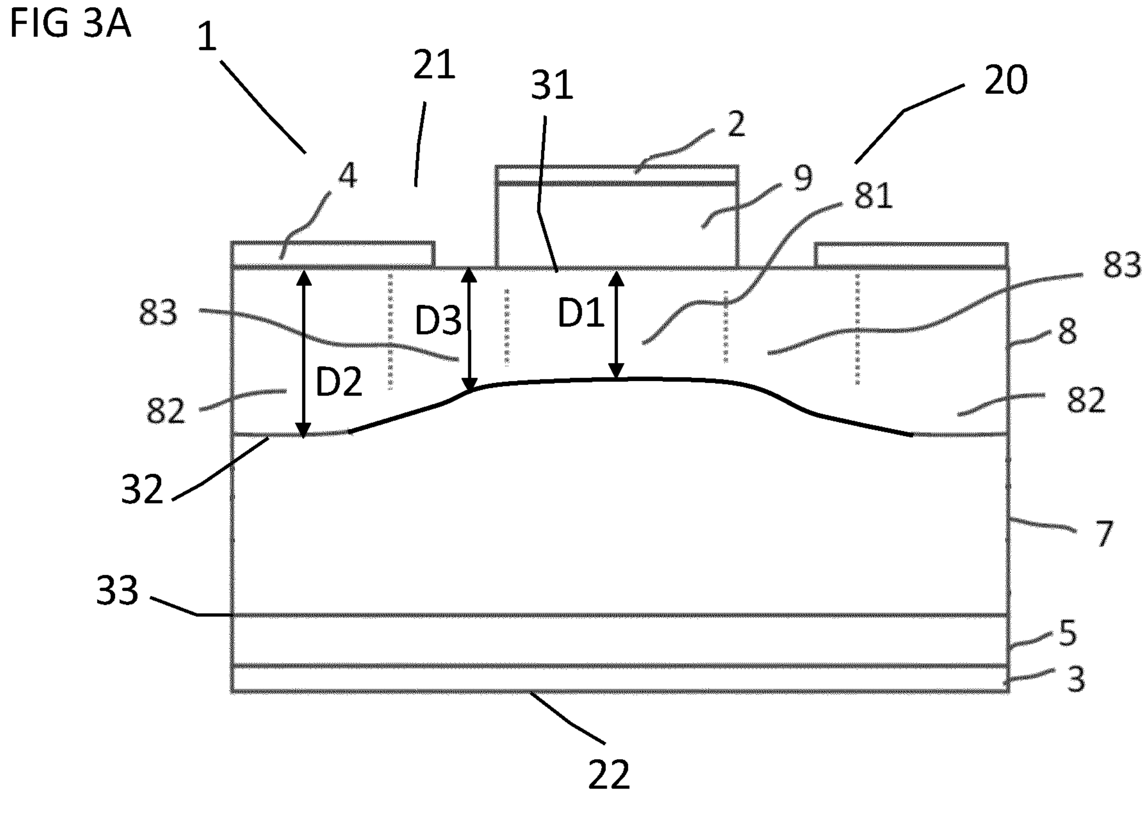

FIG. 3A is a cross section of a power semiconductor device 1 according to an embodiment which is a further development of the embodiments shown in FIGS. 1 and 2. The gate-commutated thyristor cell 20 is free of a buffer layer 6. The drift layer 7 and the anode layer 5 form the third junction 33. The base layer 8 includes at least three distinct base regions, namely the cathode base region 81, the gate base region 82 and an intermediate base region 83. The cathode base region 81 has a relatively small depth and a relatively small maximum doping concentration to allow for reduced electrons recombination, smaller sheet resistance and reduced wafer thickness. The gate base region 82 has a relatively large depth and maximum doping concentration to pull plasma from deep inside the drift layer 7 (which can be named second base layer) during turn-off and to affix the location of high electric field and dynamic avalanche carriers' generation at the desired location right under the gate electrode 4 and to support increased voltage. Thus, during turn-off the plasma removal process is faster, and any carriers generated by dynamic avalanche are removed by the gate electrode 4 without reaching the vicinity of the cathode region 9 or cathode electrode 2.

The cathode base region 81 is located vertically under a central part of the cathode region 9. The gate base region 82 is located vertically under a central part of the gate electrode 9. The intermediate base region 83 is located vertically under the gap between the cathode region 9 and the gate electrode 4, but may additionally also be located under an edge part of the gate electrode 9 and an edge part of the cathode region 9.

The intermediate base region 83 has an intermediate depth and intermediate maximum doping concentration when compared to the gate base region 82 and cathode base region 81. The depth, width and maximum doping concentration of the intermediate base region 83 is what determines the exact realms of the two other regions 81, 82 as well as the shape of the transition area. Further, by having a distinct intermediate level one extra degree of freedom in optimization is achieved, essentially allowing the other two base regions 81, 82 to be optimized independently, the cathode base region 81 for best on-state performance and the gate base region 82 for best turn-off performance, breaking the trade-off between turn-off ability and on-state performance. Advantageously, the power semiconductor device 1 achieves to accurately pinpoint the region of high dynamic avalanche, and to completely suppress the avalanche created carriers and high current density from re-triggering the thyristor whilst turning off in open base transistor mode. At the same time, it allows for the cathode base region 81 to be designed shallow to improve the on-state performance. Advantageously, the power semiconductor device 1 achieves an increased turn-off capability and reduced on-state voltage drop. The power semiconductor device 1 increases the maximum controllable current (MCC) together with lowering the on-state voltage drop.

The cathode base region 81 has a first depth D1. The first depth D1 is the minimum distance between the cathode region 9 and the drift layer 7. The first depth D1 has a value in a range between 5 μm and 110 μm, alternatively between 20 μm and 110 μm and alternatively between 50 μm and 80 μm. The values use may be selected for a 4.5 kV GCT cell 20, but also for other GCT cells.

The gate base region 82 has a second depth D2. The second that is the maximum distance between the gate electrode 4 and the drift layer 7. The second depth D2 has a value in a range between 70 μm and 160 μm and alternatively between 100 μm and 130 μm.

The intermediate base region 83 has a third depth D3. The third depth 83 has at least two different values. Typically, the third depth D3 has more than two different values. The values of the third depth D3 are in a range between 30 μm and 140 μm and alternatively between 80 μm and 100 μm. A depth of the base layer 8 is e.g. a thickness of the base layer 8. The third depth D3 is e.g. a thickness of the intermediate base region 83. The third depth D3 is e.g. a distance of a surface of the intermediate base region 83 to the drift layer 7.

The values use selected such that the first depth D1 is less than the second depth D2. The third depth D3 is between the first depth D1 and the second depth D2. The at least two values or each value of the third depth D3 are between the first depth D1 and the second depth D2. Since the third depth has a least two different values, the second junction 32 has e.g. a slope or step at the intermediate base region 83.

In case the value of the first depth D1 is the minimum distance between the cathode region 9 and the drift layer 7 and in case the value of the second depth D2 is the maximum distance between the gate electrode 4 and the drift layer 7, then the value of the first depth D1 is less than the value of the second depth D2. The at least two values or each value of the third depth D3 are smaller than said value of the second depth D2 and larger than said value of the first depth D1.

A part of the second junction 32 or interface which is located between the cathode base region 81 and the drift layer 7 is at least partially located in a first plane. A part of the second junction 32 or interface which is located between the gate base region 82 and the drift layer 7 is at least partially located in a second plane. The interface or the part of the second junction 32 which is located between the intermediate base region 83 and the drift layer 7 is located between the first and the second plane. The first and the second plane are parallel to the first main side 21.

A width W1 of the cathode region 9 or a width of the cathode electrode 2 is in a range between 50 μm and 250 μm, alternatively between 100 μm to 200 μm. Advantageously, the width W1 is small, in case the p-base is shallow. When for example the base layer 8 is shallower than 75 μm, a narrow finger, e.g. <150 μm will help improve the MCC. A width W2 of the gate electrode 4 is typically of equal dimensions to the width W1 of the cathode region 9. The proposed design leads to a failure mechanisms with higher ratings. The width W1 is the distance of one edge of the cathode region 9 to the opposite edge of the cathode region 9 in the cross section shown in FIG. 4. The width W2 is the distance of one edge of the gate electrode 4 to the opposite edge of the gate electrode 4 in the cross section shown in FIG. 4.

The power semiconductor device 1 achieves a good MCC trade off, it allows for a much reduced on-state voltage drop and at the same time higher current controllability. This can be achieved by structuring the base layer 8 with at least three different levels of maximum doping concentration and depth. The power semiconductor device 1 allows better handling of the carriers generated during dynamic avalanche and better extraction of plasma and holes during turn-off. Thus, any localized increase in current density does not have the negative impact of latching the thyristor. This can be achieved without increasing the on-state voltage drop. Contrary to the embodiment shown in FIG. 3A, the examples shown in FIGS. 1 and 2 feature either a uniform base depth or only two distinct base regions.

The gate-commutated thyristor cell 20 is realized by double corrugation. The second junction 32 between the base layer 8 and the drift layer 7 is not flat.

In an alternative, not shown embodiment, the gate-commutated thyristor cell 20 includes more than three distinct p-base regions.

Figure 3B:
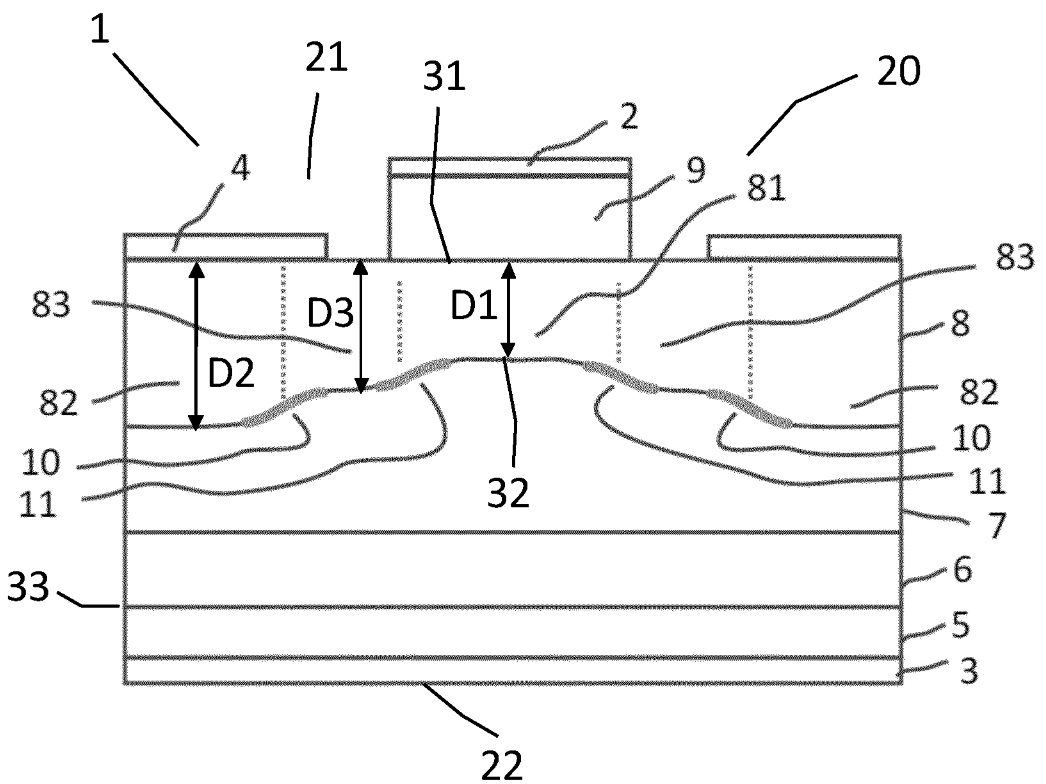

FIG. 3B is a cross section of a power semiconductor device 1 according to an embodiment which is a further development of the embodiments shown in FIGS. 1 and 2. The interface or junction of the intermediate base region 83 to the drift layer 7 includes a first and a second base transition region 10, 11. The shape of the first and the second base transition regions 10, 11 adds a lateral velocity component pointing towards the gate electrode 4 for the holes travelling from the anode layer 5.

Figure 4:
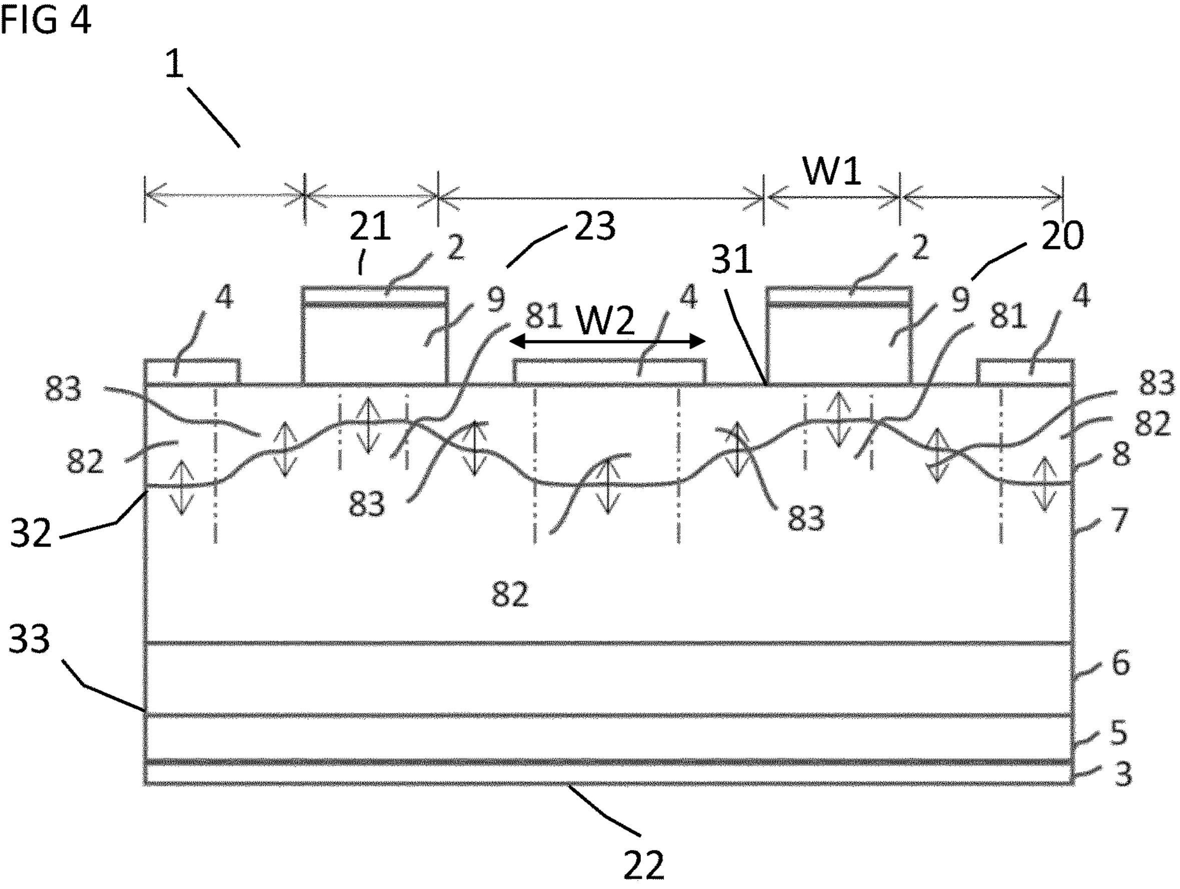

FIG. 4 is a cross section of a power semiconductor device 1 according to an embodiment which is a further development of the embodiments shown in FIGS. 1, 2, 3A and 3B. The power semiconductor device 1 includes a number M of gate-commutated thyristor cells 20. In this example, the number M is 2. The power semiconductor device 1 comprises the gate-commutated thyristor cell 20 and a further gate-commutated thyristor cell 23. Typically, a number M of cells is larger than 2.

The width W1 of the cathode region 9 is in a range between 50 μm and 250 μm, alternatively between 100 μm and 200 μm. A width W2 of the gate electrode 4 is in a range between 50 μm and 250 μm, alternatively between 100 μm and 200 μm. A difference between the width W1 of the cathode region 9 and the width W2 of the gate electrode 4 is in a range of 10 μm to 70 μm. Alternatively, the difference is less than 30 μm, alternatively less than 10 μm and alternatively less than 5 μm.

In an example, the distance between the cathode region 9 and the drift layer 7 can be as small as 10 μm, in order to minimize the on-state voltage drop. Furthermore, the MCC increases when the cell dimensions reduce, and the gate-cathode interdigitation can increase; for example, the cathode layer width W1 is less than 250 μm. Advantageously, the MCC can be increased or remain unaltered in case of reducing the cell dimensions and increasing the gate-cathode interdigitation. This is because the thyristor cell 20 latches at higher current densities.

Thus, the distance between the cathode region 9 and the second junction 32 (the distance is also named first depth D1) can be as small as 10 μm and the width W1 of the cathode region 9 less than 200 μm. The power semiconductor device 1 resembles a combination of very shallow cathode base region 81 and narrow cathode segment width W1. In this case, the cell dimensions reduce proportionally (e.g. 10% deviation is allowed) and an equivalent increase in gate-cathode interdigitation is achieved, whilst the total active area of the GCT cell 20 stays approximately unaltered.

In an example, the power semiconductor device 1 is fabricated on a wafer, e.g. on a 91 mm wafer which may be a GCT wafer. The power semiconductor device 1 implements a fine pattern GCT (narrow cathode and gate regions with very shallow cathode base region). The wafer is e.g. a silicon wafer. A single wafer may include exactly one power semiconductor device 1. The power semiconductor device 1 has the size of one wafer.

The gate-commutated thyristor cell 20 with narrower cathode and gate regions (e.g. cathode region width W1 below 250 μm) results in a fine pattern GCT with optional shapes of cathodes electrodes 2 and/or cathode regions 9 for flexible design for a low gate resistance and inductance including more degree of freedom for an improved performance and design automation.

Figure 5:
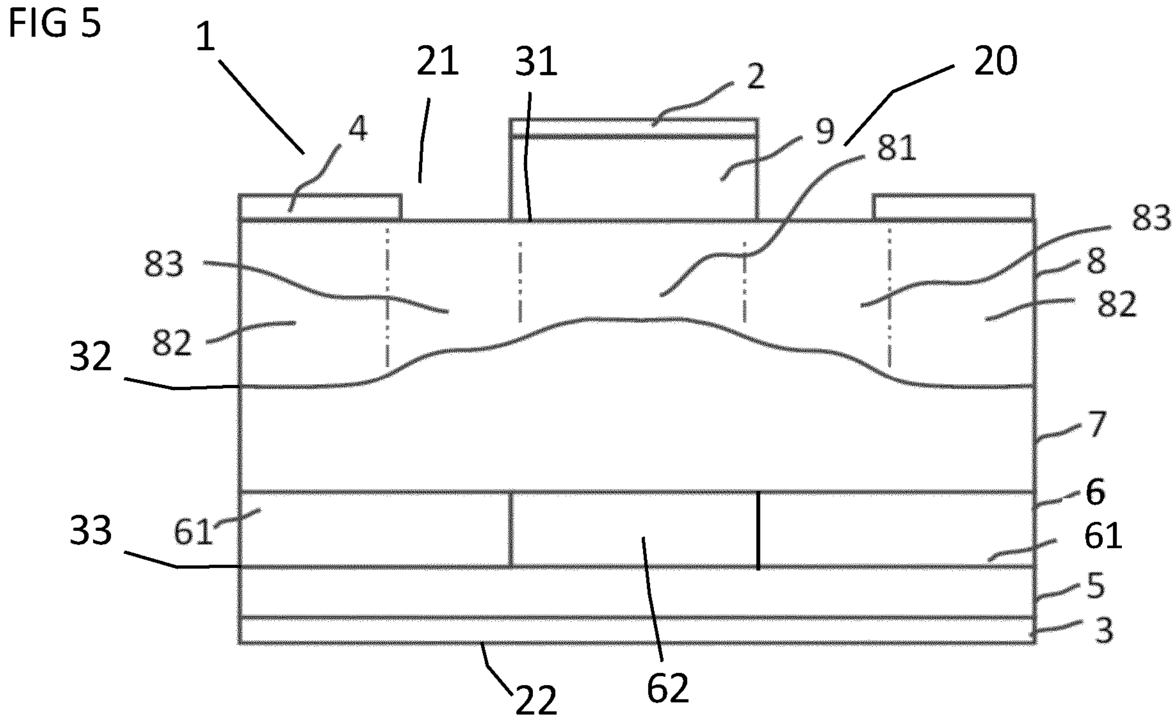

FIG. 5 is a cross section of a power semiconductor device 1 according to an embodiment which is a further development of the embodiments shown in FIGS. 1 to 4. In the power semiconductor device 1, the avalanche current is confined in areas under the gate electrode 4 and the first junction 31 (which can be named cathode/base layer junction) is kept reverse biased. Thus, at the onset of failure it is the open base PNP which fails to turn off. To overcome this and to further improve the turn-off capability, the PNP transistor gain can be reduced by a split buffer design, shown in FIG. 5, and/or a split anode design, shown in FIG. 6.

In the split buffer design, the buffer 6 comprises a gate buffer region 61 and a cathode buffer region 62. The gate buffer region 61 is at least directly under the gate electrode 4. Additionally, the gate buffer region 61 may also be under the gap between the cathode region 9 and the gate electrode 4. The cathode buffer region 62 is directly under the cathode region 9. The gate buffer region 61 has a higher maximum doping concentration in comparison to the cathode buffer region 62.

Thus, the buffer layer 6 is split in two distinct areas, one which is located vertically under the cathode region 9 and one that is located under the gate electrode 4. The increased maximum doping concentration of the gate buffer region 61 reduces the PNP transistor gain.

Figure 6:
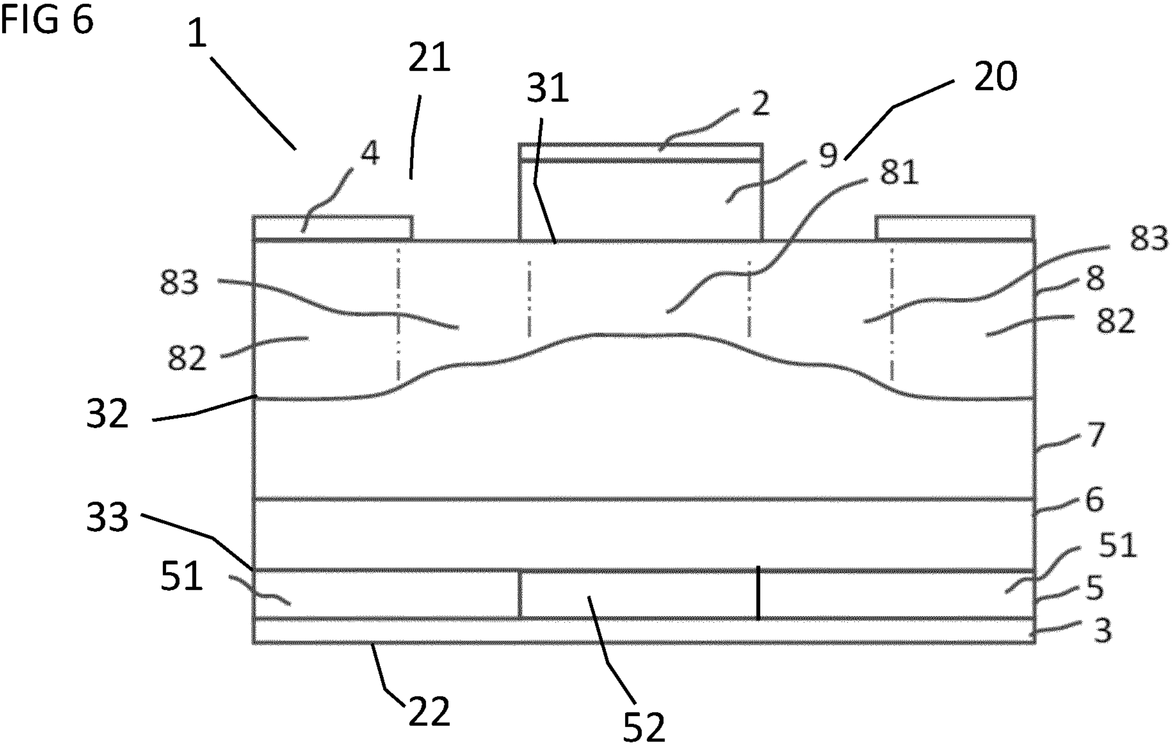

FIG. 6 is a cross section of a power semiconductor device 1 according to an embodiment which is a further development of the embodiments shown in FIGS. 1 to 5. The anode layer 5 comprises a gate anode region 51 and a cathode anode region 52. The gate anode region 51 is at least directly under the gate electrode 4. Additionally, the gate anode region 51 may also be under the gap between the cathode region 9 and the gate electrode 4. The cathode anode region 52 is directly under the cathode region 9. Thus, the anode layer 5 is split in two distinct areas or regions, one which is located vertically under the cathode region 9 and one that is located under the gate electrode 4. The gate anode region 51 has a lower maximum doping concentration in comparison to the cathode anode region 52, e.g. to reduce the PNP transistor gain.

Figures 7, 8:
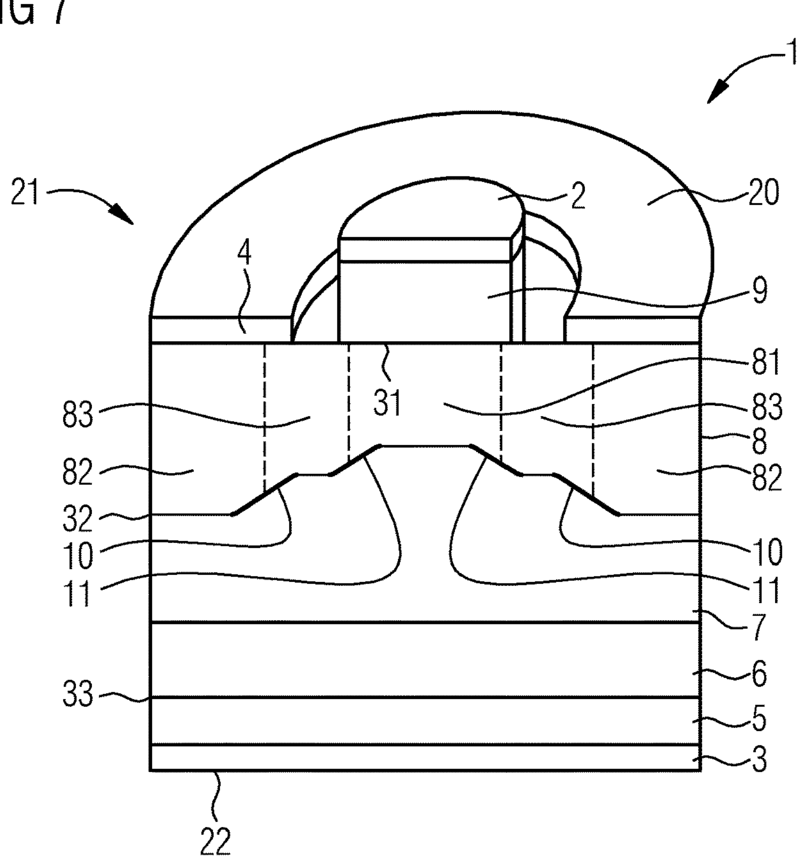
FIGS. 7 and 8 are perspective views of a power semiconductor device according to different embodiments.

FIG. 7 is a perspective view of a power semiconductor device 1 according to an embodiment which is a further development of the embodiments shown in FIGS. 1 to 6. The gate electrode 4 encloses the cathode region 9 and, thus, also the cathode electrode 2. Correspondingly, the intermediate base region 83 encloses the cathode base region 81. Moreover, the gate base region 82 encloses the intermediate base region 83.

FIG. 8 is a perspective view of a power semiconductor device 1 according to an embodiment which is a further development of the embodiments shown in FIGS. 1 to 7. The gate-commutated thyristor cell 20 is realized as a planar GCT or flat GCT; thus, the silicon is not etched, i.e. the first main side 21 of the silicon is flat. The cathode region 9 is connected to the base layer 8 and thus to the cathode base region 81. The cathode region 9 is fabricated inside the substrate of the power semiconductor device 1. An insulation between gate and cathode is achieved through the difference in height of the metallization of the gate and the cathode. The cathode metallization is thicker compared to the gate metallization. The gate-commutated thyristor cell 20 further includes an additional cathode metallization 2*a* which is located between the cathode electrode 2 and the cathode region 9. Thus, the double layer of the cathode electrode 2 and of the additional cathode metallization 2*a* is thicker than the gate electrode 4. Optionally, the examples of the power semiconductor device 1 shown in the other figures can include the cathode region 9 and/or the additional cathode metallization 2*a* as explained in FIG. 8. FIGS. 7, 8 and 9A to 9D illustrate designs of the cathode electrode 2 and cathode region 9 with circular and hexagonal shape and planar and mesa cathode design examples. The substrate of the power semiconductor device 1 is at least one of silicon and a wide-bandgap semiconductor, such as e.g. silicon carbide.

Figure 9A:
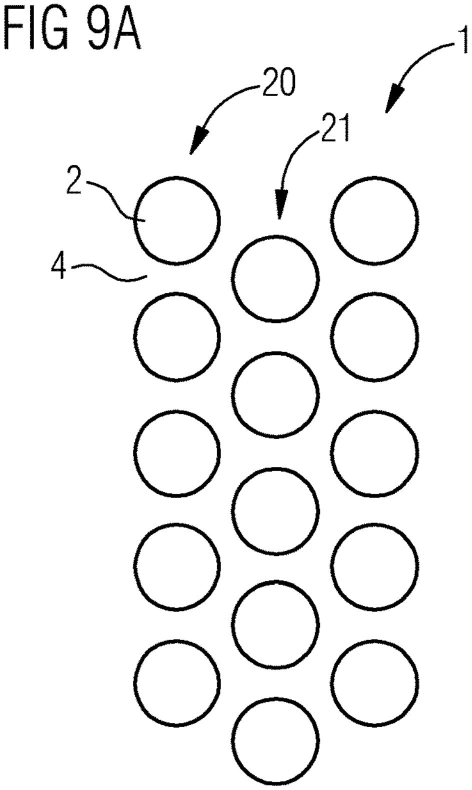
FIG. 9A to 9D are top views of a power semiconductor device according to different embodiments.
Figure 9B:
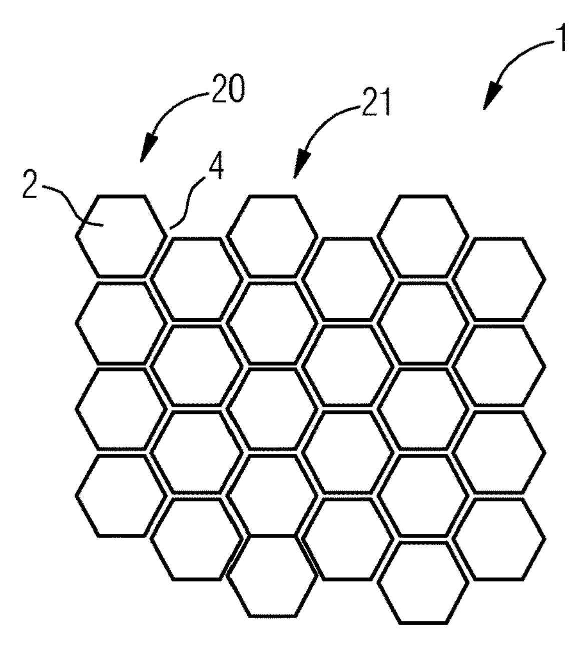
Figure 9C:
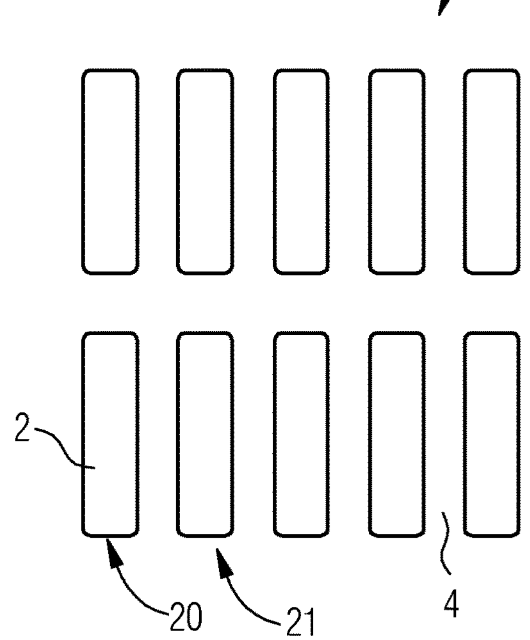
Figure 9D:
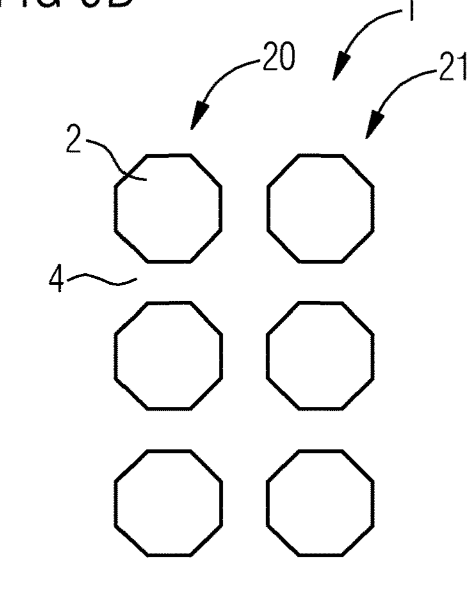

FIG. 9A to 9D are top views of a power semiconductor device 1 according to different embodiments which are further developments of the embodiments shown in FIGS. 1 to 8. The cathode region 9 and thus the cathode electrode 2 may have the form of a circle, as shown in FIG. 9A, the form of a hexagon, as shown in FIG. 9B, the form of a rectangle or stripe, as shown in FIG. 9C, and/or the form of a octagon, as shown in FIG. 9D. Other forms are also suitable. The possibility to reduce the cathode segment feature size allows to realize different shapes of the cathode region 9 and the cathode electrode 2. A designer can use the stripe shape of the cathode finger (FIG. 9C) and/or the hexagonal or circular cell concepts (more suitable for technologies with a low-resolution lithography) together with planar GCT concept as shown in FIGS. 7 and 8. The benefit is a further improvement of electrical parameters (MMC) and a possible processing of the cathode and gate regions narrower than 250 μm described above.

Figure 10:
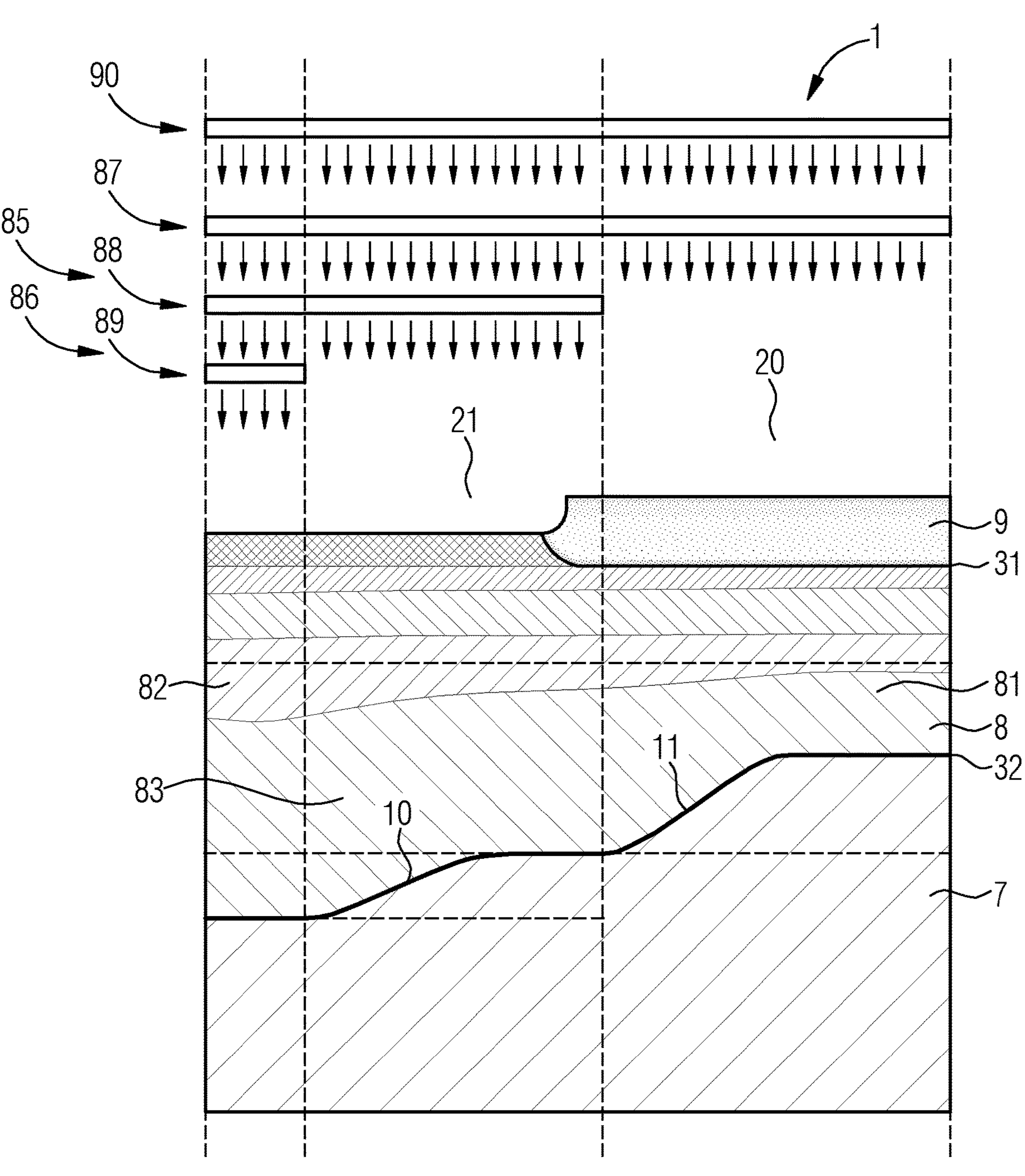
FIG. 10 shows a cross section and masks of a power semiconductor device according to an embodiment.

FIG. 10 shows a cross section and masks of a power semiconductor device 1 according to an embodiment which is a further development of the embodiments shown in the figures above. The base layer 8 is fabricated by performing at least a gate base doping process 86, an intermediate base doping process 85 and a cathode base doping process 87. The intermediate base doping process 85 includes depositing a first mask 88 covering at least part of an area of the cathode region 9 and performing a first ion implantation process. The gate base doping process 86 includes depositing a second mask 89 covering the area of the cathode region 9 and at least a part of an area of the intermediate base region 83 and performing a second ion implantation process. The cathode base doping process 87 includes performing a third ion implantation process without using a mask. In FIG. 10, the bold rectangles indicate the areas which allow that ions are provided to the first main side 21 by ion implantation. The ions are indicated by arrows.

The gate base doping process 86, the intermediate base doping process 85 and the cathode base doping process 87 provide a doping of the second conductivity type. The gate base doping process 86 is configured to realize an implanted low doped p-region with the second mask 89 to obtain the gate base region 82. The intermediate base doping process 85 is configured to realize an implanted low doped p-region with the first mask 88 to obtain the intermediate base region 83. The cathode base doping process 87 is configured to realize an implanted low doped p-region without mask to obtain the cathode base region 81.

Additionally, a shallow base doping process 90 is performed without mask. The shallow base doping process is configured to fabricate an implanted high doped region of the base layer 8, namely at the interface of the base layer 8 towards the first main side.

The gate base doping process 86, the intermediate base doping process 85, the cathode base doping process 87 and the shallow base doping process 90 provide a doping of the second conductivity type (a p-doping).

The further processes for fabricating the power semiconductor device 1 are conventional processes or steps. The further processes include:

- providing a semiconductor substrate with the drift layer 7 of the first conductivity type,
- providing the cathode region 9 of the first conductivity type,
- providing the anode layer 5 of the second conductivity type,
- providing the cathode electrode 2 on the first main side 21 and the gate electrode 4 on the first main side lateral to the cathode region 9, and
- providing the anode electrode 3 on the second main side 22.

The order of the processes during fabrication may be different than in the order as written above. The method for fabrication may include further processes which are not mentioned above, e.g. providing of a passivation layer.

After fabricating the power semiconductor device 1, e.g. after the three base doping processes 85 to 87 and after the last annealing step and/after the last high temperature step, the base layer 8 comprises the intermediate base region 83, the cathode base region 81 and the gate base region 82, as described above. An example of the dopant distribution is shown in FIG. 10.

Optionally, the buffer layer 6 is additionally provided.

Figure 11:
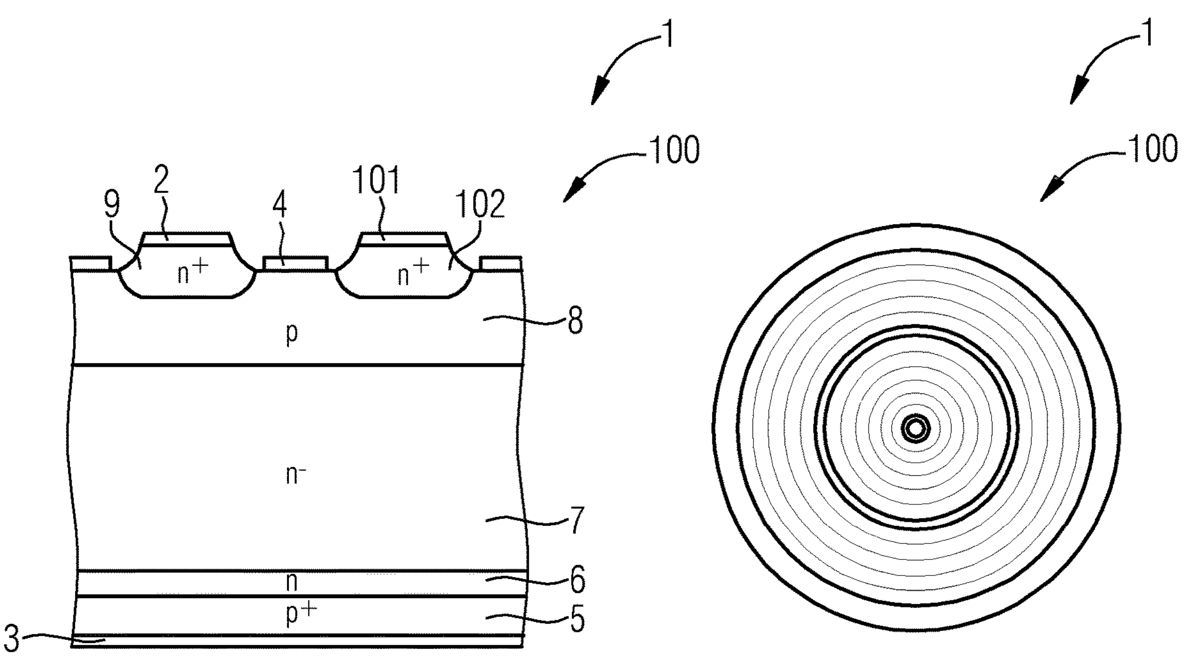
FIGS. 11, 12, 13 and 14 are views and characteristics of a power semiconductor device according to different embodiments.
Figure 11:
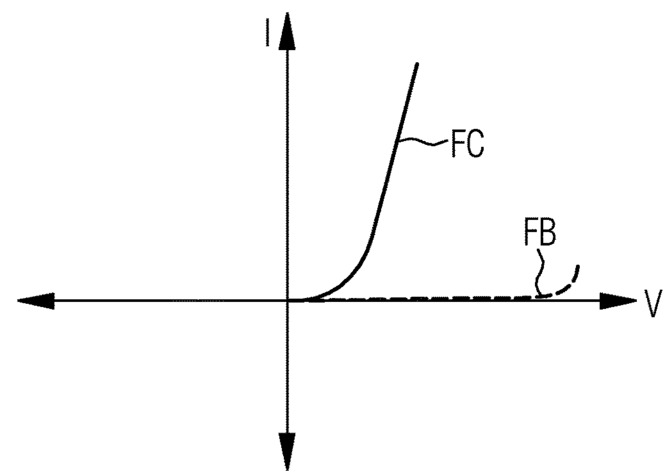
Figure 12:
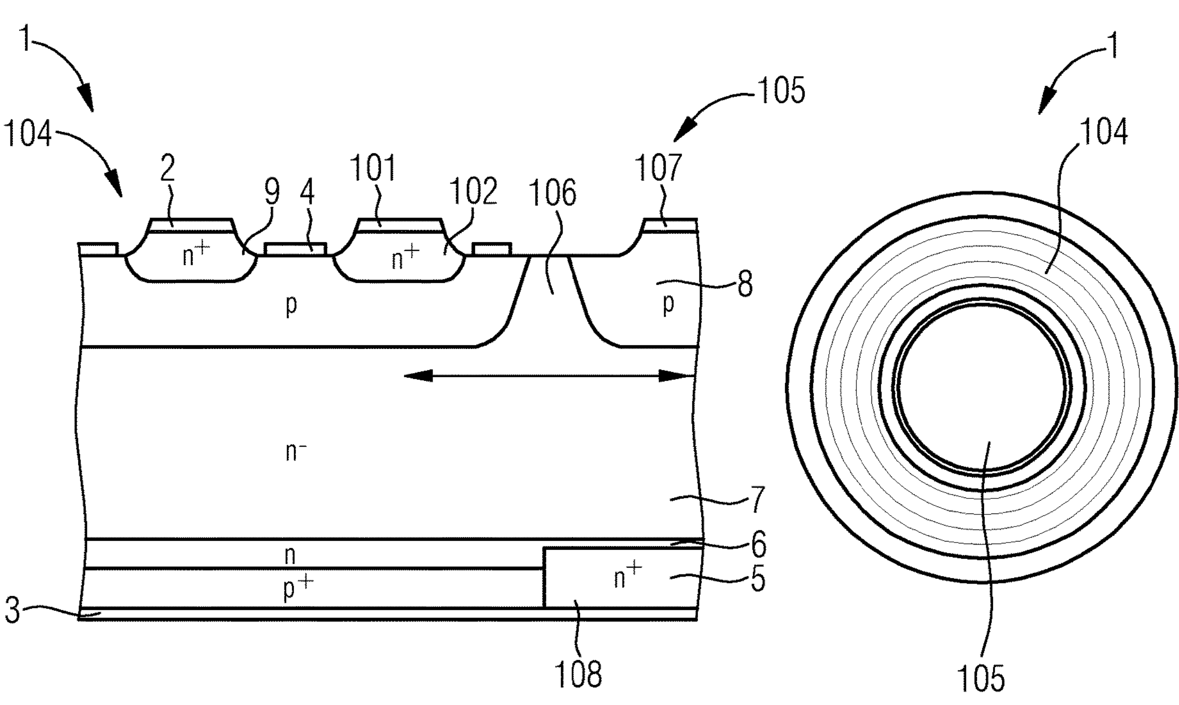
Figure 12:
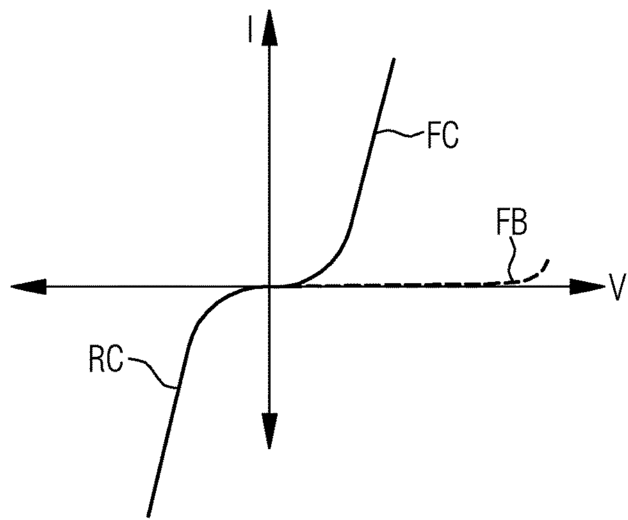
Figure 13:
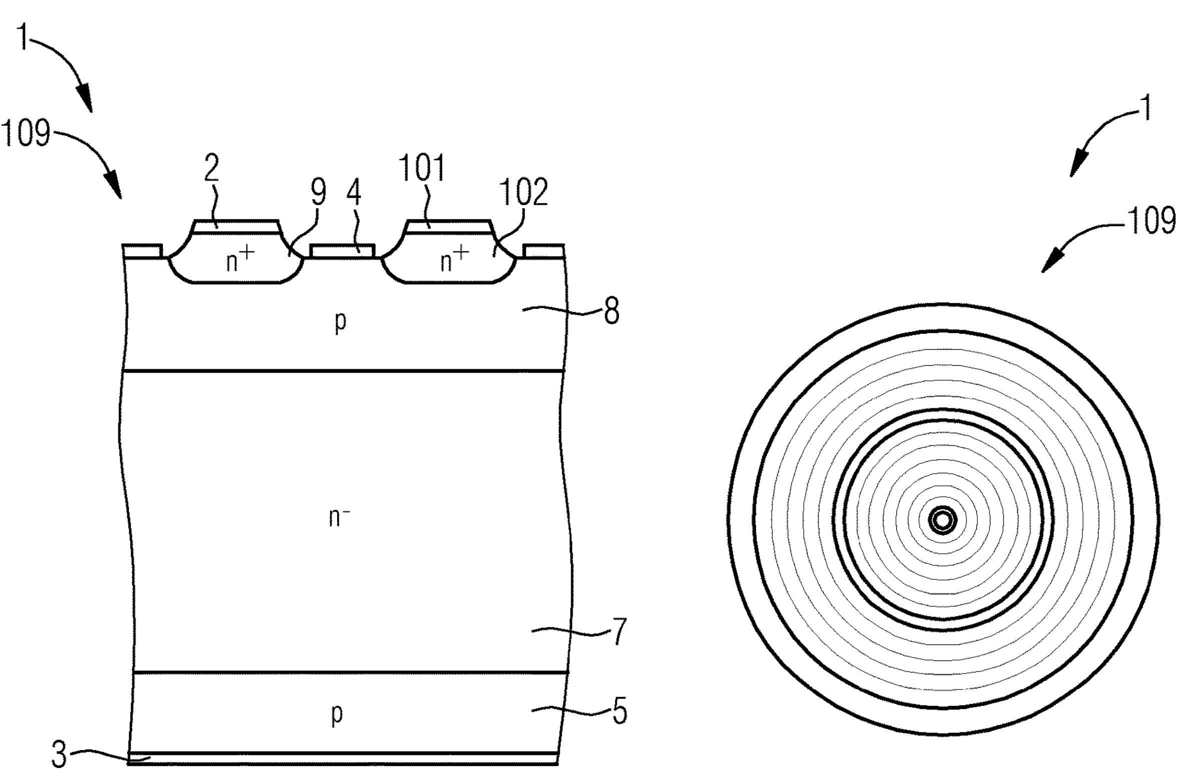
Figure 13:
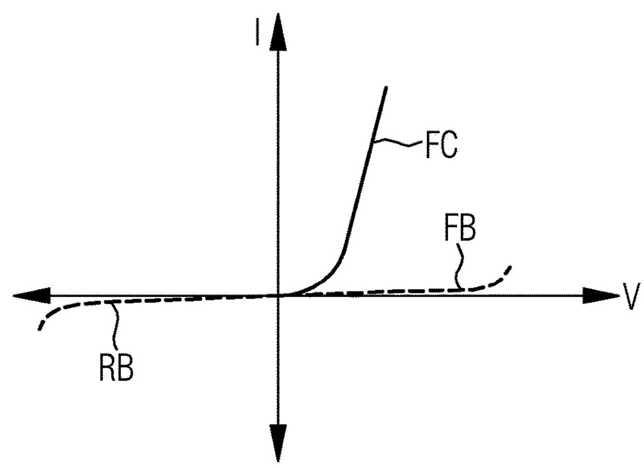

FIGS. 11 to 14 are views and characteristics of a power semiconductor device 1 according to different embodiments which are further developments of the embodiments shown above. In FIGS. 11 to 13, a cross section, a top view and a current/voltage characteristic of a power semiconductor device 1 are illustrated. As shown in FIG. 11, the gate-commutated thyristor cell 20 is realized as an asymmetric integrated gate-commutated thyristor cell 100, abbreviated asymmetric IGCT cell. The gate-commutated thyristor cell 20 comprises a further cathode electrode 101 and a further cathode region 102. In the I/V characteristic, FC stands for forward conduction and FB stands for forward blocking.

As elucidated in FIG. 12, the gate-commutated thyristor cell 20 is realized as reverse conducting integrated gate-commutated thyristor cell 104, RC-IGCT cell. The power semiconductor device 1 additionally comprises a diode 105. As shown in the cross-section in FIG. 12, a separation region 106 separates the gate-commutated thyristor cell 20 or cells from the diode 105. The diode 105 is realized as a PN junction having a diode anode 107 and a diode cathode 108. The diode anode 107 is located at the first main side 21. The diode cathode 108 is located at the second main side 22. RC stands for reverse conduction.

As illustrated in FIG. 13, the gate-commutated thyristor cell 20 is realized as reverse blocking gate-commutated thyristor cell 109, abbreviated RB-IGCT. In this example, the buffer layer 6 is omitted. RB stands for reverse blocking.

Figure 14:
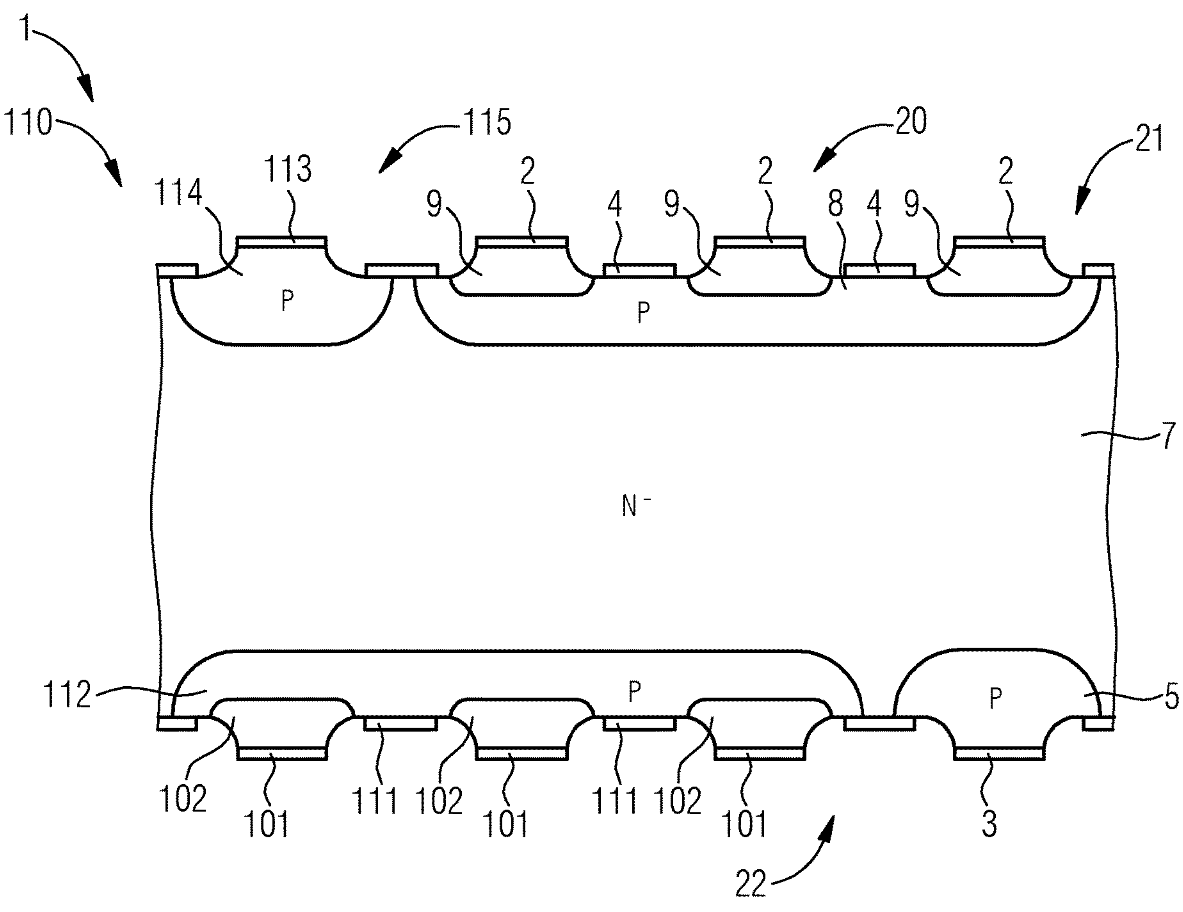

Moreover, as shown in FIG. 14, the power semiconductor device 1 is realized as a bidirectional turn-off thyristor 110, abbreviated BTT, and comprises the gate-commutated thyristor cell 20 and a further gate-commutated thyristor cell 115 which is connected antiparallel to the gate-commutated thyristor cell 20. The further gate-commutated thyristor cell 115 comprises the further cathode electrode 101, the further cathode region 102, a further gate electrode 111, a further base layer 112, a further anode electrode 113 and a further anode layer 114.

The base layer 8 of the examples shown in FIGS. 11 to 14 are realized such as shown in the FIG. 3A, 3B or 4. Thus, the new gate-cathode design concept can be applicable to different GCT families such as asymmetric IGCT, reverse conducting IGCT, reverse blocking IGCT and BTT.

While the disclosure is amenable to various modifications and alternative forms, specifics thereof have been shown by way of example in the figures and will be described in detail. It should be understood, however, that the intention is not to limit the disclosure to the particular embodiments described. On the contrary, the intention is to cover all modifications, equivalents and alternatives falling within the scope of the disclosure defined by the appended claims.

The embodiments shown in the FIGS. 1 to 14 as stated represent exemplary embodiments of the improved power semiconductor device 1 and the fabrication method; therefore, they do not constitute a complete list of all embodiments according to the improved power semiconductor device and method. Actual power semiconductor devices and methods may vary from the embodiments shown in terms of arrangements, devices, layers, regions, designs and processes for example.

REFERENCE SIGNS

1 power semiconductor device
2 cathode electrode
2*a* additional cathode metallization 2*a*
3 anode electrode
4 gate electrode
anode layer
6 buffer layer
7 drift layer
8 base layer
9 cathode region
first base transition region
11 second base transition region
13 cathode area
gate-commutated thyristor cell
21 first main side
22 second main side
31 first junction
32 second junction
33 third junction
51 gate anode region
52 cathode anode region
61 gate buffer region
62 cathode buffer region
81 cathode base region
82 gate base region
83 intermediate base region
85 intermediate base doping process
86 gate base doping process
87 cathode base doping process
90 shallow base doping process
100 asymmetric integrated gate-commutated thyristor cell
101 further cathode electrode
102 further cathode region
104 reverse conducting integrated gate-commutated thyristor cell
105 diode
106 separation region
107 diode anode
108 diode cathode
109 reverse blocking integrated gate-commutated thyristor cell
110 bidirectional turn-off thyristor cell
111 further gate electrode
112 further base layer
113 further anode electrode
114 further anode layer

The invention claimed is:

1. A power semiconductor device comprising a gate-commutated thyristor cell, a first main side and a second main side opposite to the first main side, wherein the gate-commutated thyristor cell comprises in an order from the first main side to the second main side:
-a cathode electrode arranged on the first main side,
a cathode region of a first conductivity type,
a base layer of a second conductivity type different than the first conductivity type forming a first junction to the cathode region,
a drift layer of the first conductivity type forming a second junction with the base layer,
an anode layer of the second conductivity type, and
an anode electrode arranged on the second main side, wherein the gate-commutated thyristor cell further comprises a gate electrode which is arranged lateral to the cathode region, wherein the base layer comprises:
-a cathode base region located between the cathode region and the drift layer and having a first depth,
a gate base region located between the gate electrode and the drift layer and having a second depth, and
an intermediate base region located between the cathode base region and the gate base region and having at least two different values of a third depth, wherein the at least two values of the third depth are both larger than the first depth and smaller than the second depth, wherein a maximum doping concentration of the gate base region is higher than a maximum doping concentration of the intermediate base region, wherein the maximum doping concentration of the intermediate base region is higher than a maximum doping concentration of the cathode base region, and wherein a part of the second junction, which is located between the intermediate base region and the drift layer, includes a first base transition region forming a step and a second base transition region forming another step.

2. The power semiconductor device of claim 1, wherein the intermediate base region includes a region between a gap between the gate electrode and the cathode region on one side and the second junction on an other side.

3. The power semiconductor device of claim 2, wherein the intermediate base region additionally includes at least one of an adjacent region between the gate electrode and the second junction and an adjacent region between the cathode region and the second junction.

4. The power semiconductor device of claim 1, wherein a maximum doping concentration of the gate base region in an area closest to the first main side is higher than a maximum doping concentration of the cathode base region closest to the first main side.

5. The power semiconductor device of claim 1, wherein the first depth is a minimum depth of the cathode base region, wherein the second depth is a maximum depth of the gate base region, wherein the at least two values of the third depth are larger than the first depth and less than the second depth.

6. The power semiconductor device of claim 1, wherein the first depth is a minimum distance of the cathode region to the drift layer, wherein the second depth is a maximum distance of the gate electrode to the drift layer, wherein the at least two values of the third depth are larger than the first depth and less than the second depth.

7. The power semiconductor device of claim 1, wherein the first depth has a value in a range between 5 μm and 110 μm.

8. The power semiconductor device of claim 1, wherein a part of the second junction which is located between the cathode base region and the drift layer is at least partially located in a first plane and wherein a part of the second junction which is located between the gate base region and the drift layer is at least partially located in a second plane, and wherein the part of the second junction which is located between the intermediate base region and the drift layer is located between the first and the second plane.

9. The power semiconductor device of claim 1, wherein the part of the second junction which is located between the intermediate base region and the drift layer further includes a plane between the first base transition region and the second base transition region.

10. The power semiconductor device of claim 1, wherein a width of the cathode region is in a range between 50 μm and 250 μm.

11. The power semiconductor device of claim 1, wherein a difference between a width of the cathode region and a width of the gate electrode is in a range of 10 μm to 70 μm.

12. The power semiconductor device of claim 1, wherein at the first main side the cathode region has a form out of a group consisting of a circle, a rectangle, an octagon and a hexagon.

13. The power semiconductor device of claim 1, wherein the anode layer includes a gate anode region and a cathode anode region, wherein a maximum doping concentration of the gate anode region is less than a maximum doping concentration of the cathode anode region, and wherein the gate anode region is located vertically under the gate electrode, and the cathode anode region is located vertically under the cathode region.

14. The power semiconductor device of claim 1, wherein the gate-commutated thyristor cell comprises a buffer layer of the first conductivity type, wherein the buffer layer is located between the drift layer and the anode layer and includes a gate buffer region and a cathode buffer region, wherein a maximum doping concentration of the gate buffer region is higher than a maximum doping concentration of the cathode buffer region, and wherein the gate buffer region is located vertically under the gate electrode, and the cathode buffer region is located vertically under the cathode region.

15. The power semiconductor device of claim 1, wherein the gate-commutated thyristor cell is implemented as a component out of a group consisting of an asymmetric integrated gate-commutated thyristor cell, a reverse conducting integrated gate-commutated thyristor cell, a reverse blocking integrated gate-commutated thyristor cell and a bidirectional turn-off thyristor cell.

* * * * *